United States Patent
Bergendahl et al.

(10) Patent No.: US 10,424,663 B2
(45) Date of Patent: Sep. 24, 2019

(54) SUPER LONG CHANNEL DEVICE WITHIN VFET ARCHITECTURE

(71) Applicant: International Business Machines Corporation, Armonk, NY (US)

(72) Inventors: Marc A. Bergendahl, Troy, NY (US); Kangguo Cheng, Schenectady, NY (US); Gauri Karve, Cohoes, NY (US); Fee Li Lie, Albany, NY (US); Eric R. Miller, Schenectady, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/813,523

(22) Filed: Nov. 15, 2017

(65) Prior Publication Data

US 2018/0342615 A1    Nov. 29, 2018

Related U.S. Application Data

(63) Continuation of application No. 15/602,884, filed on May 23, 2017.

(51) Int. Cl.
*H01L 29/78* (2006.01)
*H01L 29/08* (2006.01)
(Continued)

(52) U.S. Cl.
CPC ...... *H01L 29/7827* (2013.01); *H01L 29/0847* (2013.01); *H01L 29/1037* (2013.01);
(Continued)

(58) Field of Classification Search
CPC ............ H01L 29/7827; H01L 29/1037; H01L 29/0847; H01L 29/6656; H01L 29/66666;
(Continued)

(56) References Cited

U.S. PATENT DOCUMENTS 7,683,428 B2 * 3/2010 Chidambarrao .. H01L 29/66787
257/302
9,466,671 B2   10/2016 Park
(Continued)

FOREIGN PATENT DOCUMENTS

CN        103017088 A    5/2013

OTHER PUBLICATIONS

List of IBM Patents or Patent Applications Treated as Related (Appendix P); Filed Nov. 15, 2017, 2 pages.
(Continued)

*Primary Examiner* — Bo Fan
(74) *Attorney, Agent, or Firm* — Cantor Colburn LLP; Vazken Alexanian

(57) ABSTRACT

Embodiments are directed to methods and resulting structures for a vertical field effect transistor (VFET) having a super long channel. A pair of semiconductor fins is formed on a substrate. A semiconductor pillar is formed between the semiconductor fins on the substrate. A region that extends under all of the semiconductor fins and under part of the semiconductor pillar is doped. A conductive gate is formed over a channel region of the semiconductor fins and the semiconductor pillar. A surface of the semiconductor pillar serves as an extended channel region when the gate is active.

9 Claims, 17 Drawing Sheets

(51) Int. Cl.
*H01L 29/10* (2006.01)
*H01L 29/66* (2006.01)
*H03K 17/687* (2006.01)
*H01L 29/786* (2006.01)
*H01L 29/06* (2006.01)
*H01L 29/49* (2006.01)
*H01L 29/51* (2006.01)

(52) U.S. Cl.
CPC .... *H01L 29/6656* (2013.01); *H01L 29/66666* (2013.01); *H01L 29/78642* (2013.01); *H03K 17/687* (2013.01); *H01L 29/0653* (2013.01); *H01L 29/4958* (2013.01); *H01L 29/4966* (2013.01); *H01L 29/517* (2013.01); *H01L 29/518* (2013.01)

(58) Field of Classification Search
CPC . H01L 29/0653; H01L 29/517; H01L 29/518; H01L 29/4966; H01L 29/4958; H03K 17/687
USPC .......................................... 438/212, 283, 583
See application file for complete search history.

(56) References Cited

U.S. PATENT DOCUMENTS

| | | | |
|---|---|---|---|
| 2006/0076613 A1* | 4/2006 | Ohyanagi | H01L 29/1066 257/330 |
| 2008/0073707 A1* | 3/2008 | Darwish | H01L 29/407 257/330 |
| 2008/0157172 A1 | 7/2008 | Lee | |
| 2014/0151757 A1 | 6/2014 | Basu et al. | |
| 2014/0191287 A1* | 7/2014 | Adam | H01L 29/4232 257/194 |
| 2016/0049402 A1* | 2/2016 | Liu | H01L 27/0924 257/369 |

OTHER PUBLICATIONS

Marc A. Bergendahl, et al. "Super Long Channel Device Within VFET Architecture," U.S. Appl. No. 15/602,884, filed May 23, 2017.

ISR and WO dated Aug. 30, 2018 cited in Application No. PCT/IB2018/053256, 11 pgs.

* cited by examiner

SUPER LONG CHANNEL DEVICE WITHIN VFET ARCHITECTURE

DOMESTIC AND/OR FOREIGN PRIORITY

This application is a continuation of U.S. application Ser. No. 15/602,884, titled "SUPER LONG CHANNEL DEVICE WITHIN VFET ARCHITECTURE," filed May 23, 2017, the entire contents of which are incorporated herein by reference.

BACKGROUND

The present invention generally relates to fabrication methods and resulting structures for semiconductor devices. More specifically, the present invention relates to super long channel devices within the vertical FET (VFET) architecture. "Super" long channel devices have channel lengths greater than the vertical fin height.

In contemporary semiconductor device fabrication processes, a large number of semiconductor devices, such as field effect transistors (FETs), are fabricated on a single wafer. Some non-planar transistor architectures, such as vertical field effect transistors (VFETs), employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while a gate is disposed on one or more of the fin or nanowire sidewalls.

SUMMARY

Embodiments of the present invention are directed to a method for fabricating a semiconductor device. A non-limiting example of the method includes forming a pair of semiconductor fins on a substrate. A semiconductor pillar is formed between the semiconductor fins. A region that extends under all of the semiconductor fins and under part of the semiconductor pillar is doped. A conductive gate is formed over a channel region of the semiconductor fins and the semiconductor pillar. A surface of the semiconductor pillar serves as an extended channel region when the gate is active.

Embodiments of the present invention are directed to a method of operating a semiconductor device. A non-limiting example of the method includes providing a semiconductor device. The semiconductor device includes a first semiconductor fin adjacent to a second semiconductor fin on a substrate and a semiconductor pillar formed between the first and second semiconductor fins. The semiconductor device further includes a conductive gate formed over a channel region of the first and second semiconductor fins and the semiconductor pillar, a source region formed on a surface of the first semiconductor fin, and a drain region formed on a surface of the second semiconductor fin. A current is passed from the source region to the drain region through a portion of the semiconductor pillar.

Embodiments of the invention are directed to semiconductor device. A non-limiting example of the semiconductor device includes a pair of semiconductor fins formed on a substrate. A semiconductor pillar is formed between the semiconductor fins on the substrate. A bottom doped region extends under all of the semiconductor fins and under part of the semiconductor pillar. A conductive gate is formed over a channel region of the semiconductor fins and the semiconductor pillar. A surface of the semiconductor pillar serves as an extended channel region when the gate is active.

Embodiments of the present invention are directed to a method for fabricating a semiconductor device. A non-limiting example of the method includes forming a pair of semiconductor fins on a substrate and a semiconductor pillar between the semiconductor fins. The semiconductor pillar is recessed pillar below a surface of the semiconductor fins. A bottom doped region that extends under all of the semiconductor fins and under part of the semiconductor pillar is doped. A conductive gate is formed over a channel region of the semiconductor fins and the semiconductor pillar. A thick oxide layer is formed between the conductive gate and the semiconductor fins and the semiconductor pillar. A source region and a drain region are formed on exposed surfaces of the semiconductor fins and a shared gate contact is formed on the conductive gate and over the semiconductor pillar. A surface of the semiconductor pillar serves as an extended channel region when the gate is active.

Embodiments of the invention are directed to semiconductor device. A non-limiting example of the semiconductor device includes a first semiconductor fin formed on a substrate and a second semiconductor fin formed on the substrate and adjacent to the first semiconductor fin. A semiconductor pillar is formed between the first and second semiconductor fins. A bottom doped region that extends under all of the semiconductor fins and under part of the semiconductor pillar is doped. A shared conductive gate is formed over a channel region of the first and second semiconductor fins and the semiconductor pillar. A source region is formed on a surface of the first semiconductor fin and a drain region is formed on a surface of the second semiconductor fin. A surface of the semiconductor pillar serves as an extended channel region when the gate is active.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
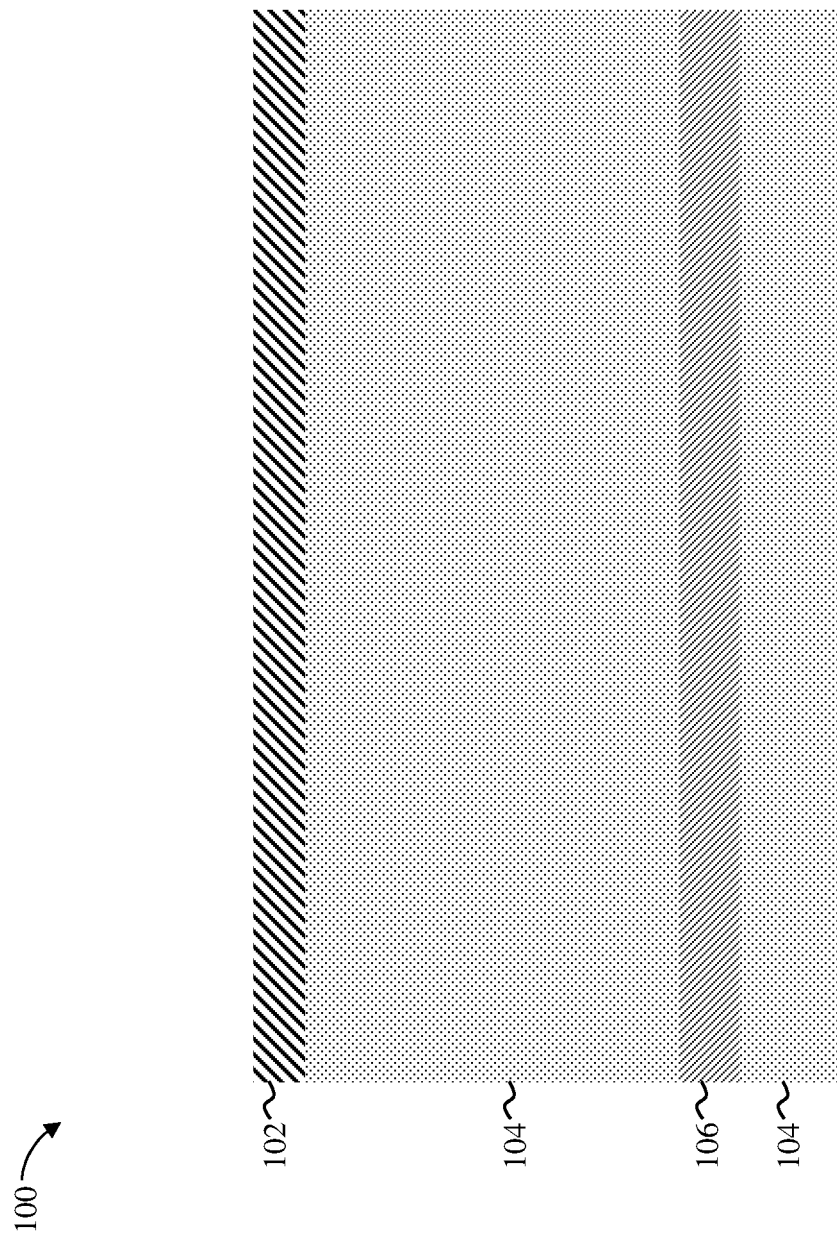
FIG. 1 depicts a cross-sectional view of a semiconductor structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. There are challenges, however, in scaling VFETs beyond the 10 nm node. For example, the vertical nature of the VFET architecture ensures that gate length manipulations impact the total layer height in addition to increases in width or area requirements. Increasing the total layer height causes several undesired complications, especially when source, drain, and gate contacts each need different lengths to satisfy a given gate length. Moreover, in a conventional VFET the integration of super long gates (i.e., gates having a channel length greater than that of a conventional short channel gate limited to the vertical fin height) is restricted by layer planarity requirements. Consequently, conventional VFETs are limited to relatively short channels.

Turning now to an overview of aspects of the present invention, one or more embodiments of the invention provide methods and structures configured to enable super long channels within the existing VFET architecture. A pair of semiconductor fins is formed on a substrate. A source region is formed on the first semiconductor fin and a drain region is formed one the second semiconductor fin. A semiconductor pillar is formed between the semiconductor fins. The semiconductor pillar can be formed having an arbitrarily long width without impacting the channel height of the semiconductor fins. A region of the substrate fully extending under the semiconductor fins and partially extending under the semiconductor pillar is doped to provide a conductive path between the semiconductor fins and the semiconductor pillar. A shared conductive gate is formed over channel regions of the semiconductor fins and the semiconductor pillar. A surface of the semiconductor pillar serves as an extended channel region when the gate is active. In this manner, a super long channel VFET is provided that does not require increases in the total layer height of the channel region.

Turning now to a more detailed description of aspects of the present invention, FIG. 1 depicts a cross-sectional view of a structure 100 having a hard mask 102 formed over a substrate 104 during an intermediate operation of a method of fabricating a semiconductor device according to one or more embodiments of the invention. A punch through stopper (PTS) 106 is formed under the hard mask 102 and within a portion of the substrate 104. The hard mask 102 can be any suitable material, such as, for example, a silicon nitride.

The substrate 104 can be any suitable substrate material, such as, for example, monocrystalline Si, SiGe, SiC, III-V compound semiconductor, II-VI compound semiconductor, or semiconductor-on-insulator (SOI). In some embodiments, the substrate 104 includes a buried oxide layer (not depicted).

Figure 5:
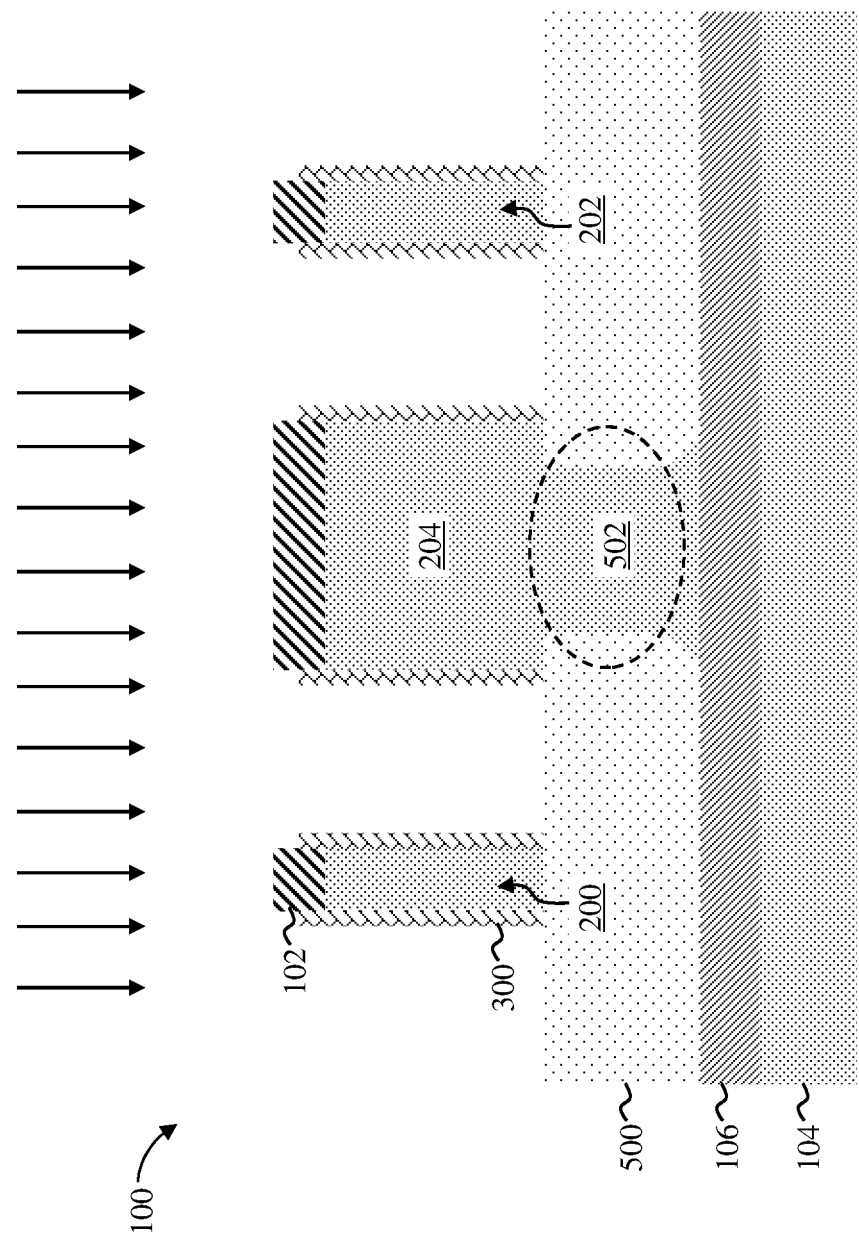
FIG. 5 depicts a cross-sectional view of the semiconductor structure after a processing operation according to one or more embodiments of the present invention.

The PTS 106 can be formed in the substrate 104 through an implantation process, such as, for example, an ion beam implantation. The PTS 106 includes dopant impurities having an opposite doping type than the source/drain regions and functions to suppress leakage between the source/drain regions during normal operation of the device and to limit the implantation depth of the bottom doped region 500 (as depicted in FIG. 5). The PTS 106 can include either n-type dopants (e.g., As, P, Sb) or p-type dopants (e.g., Ga, B, In, $BF_2$, Al) depending on the type of transistor. For example, n-type dopants are required for a pFET and p-type dopants are required for an nFET. The dopant concentration in the PTS 106 can range from $1 \times 10^{19}$ $cm^{-3}$ to $2 \times 10^{21}$ $cm^{-3}$, or between $1 \times 10^2$ $cm^{-3}$ and $1 \times 10^{21}$ $cm^{-3}$.

Figure 2:
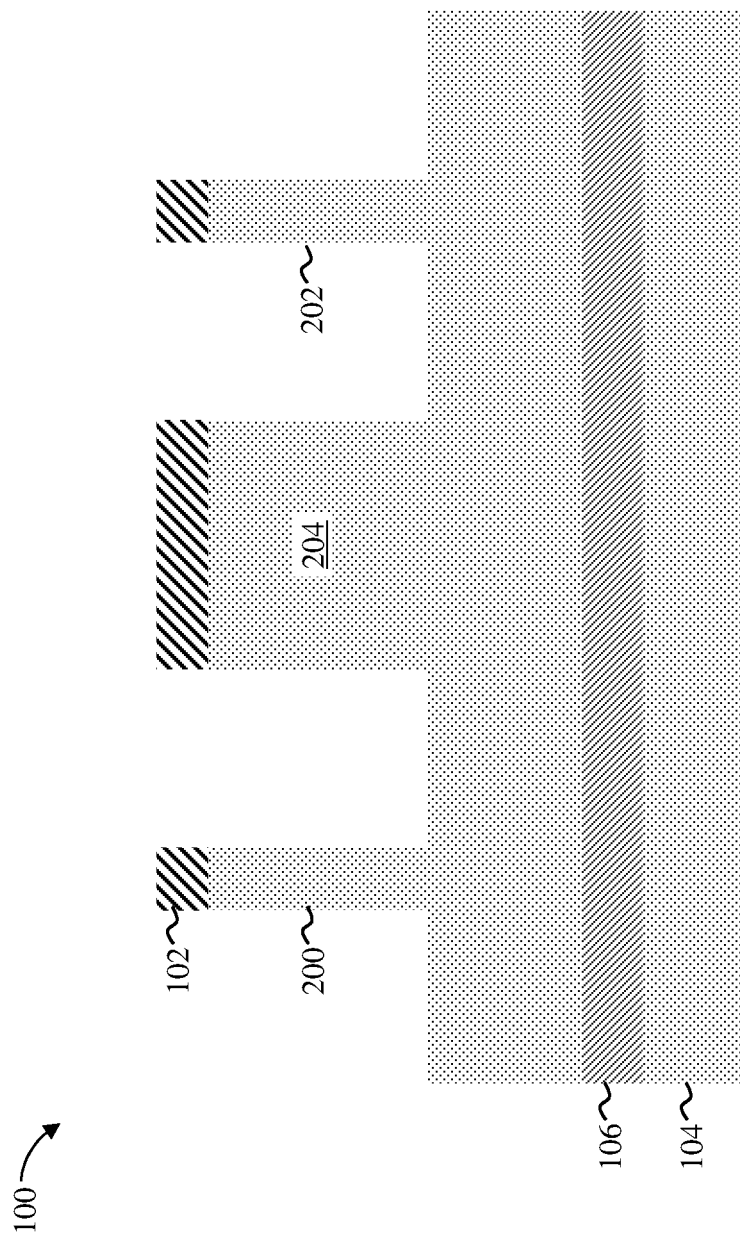
FIG. 2 depicts a cross-sectional view of the semiconductor structure after a processing operation according to one or more embodiments of the present invention.

FIG. 2 depicts a cross-sectional view of the structure 100 after forming vertical semiconductor fins 200 and 202 and a semiconductor pillar 204 on the substrate 104 during an intermediate operation of a method of fabricating a semiconductor device according to one or more embodiments of the invention. The vertical semiconductor fins 200 and 202 (hereinafter "fins") and the semiconductor pillar 204 (hereinafter "pillar") can be formed on the substrate 104 using known front-end-of-line (FEOL) VFET fabrication techniques.

In some embodiments of the invention, the hard mask 102 is patterned to expose portions of the substrate 104. The exposed portions of the substrate 104 can then be removed or recessed to form the fins 200 and 202 and the pillar 204 using a wet etch, a dry etch, or a combination thereof. The fins 200 and 202 can have a non limiting height ranging from 20 nm to 150 nm. The fins 200 and 202 can have a width ranging from 5 nm to 100 nm. The pillar 204 can have a same height as the fins 200 and 202 and can have a width ranging from 5 nm to over a micron. In some embodiments of the present invention, the width of the pillar 204 is much greater (e.g., more than twice) the width of the fins 200 and 202. In this manner, a bottom doped region 500 implantation can extend fully under the fins 200 and 202 but only partially under the pillar 204 (as depicted in FIG. 5).

The fins 200 and 202 and the pillar 204 can be electrically isolated from other regions of the substrate 104 by a shallow trench isolation (not depicted). The shallow trench isolation can be of any suitable dielectric material, such as, for example, a silicon oxide.

Figure 3:
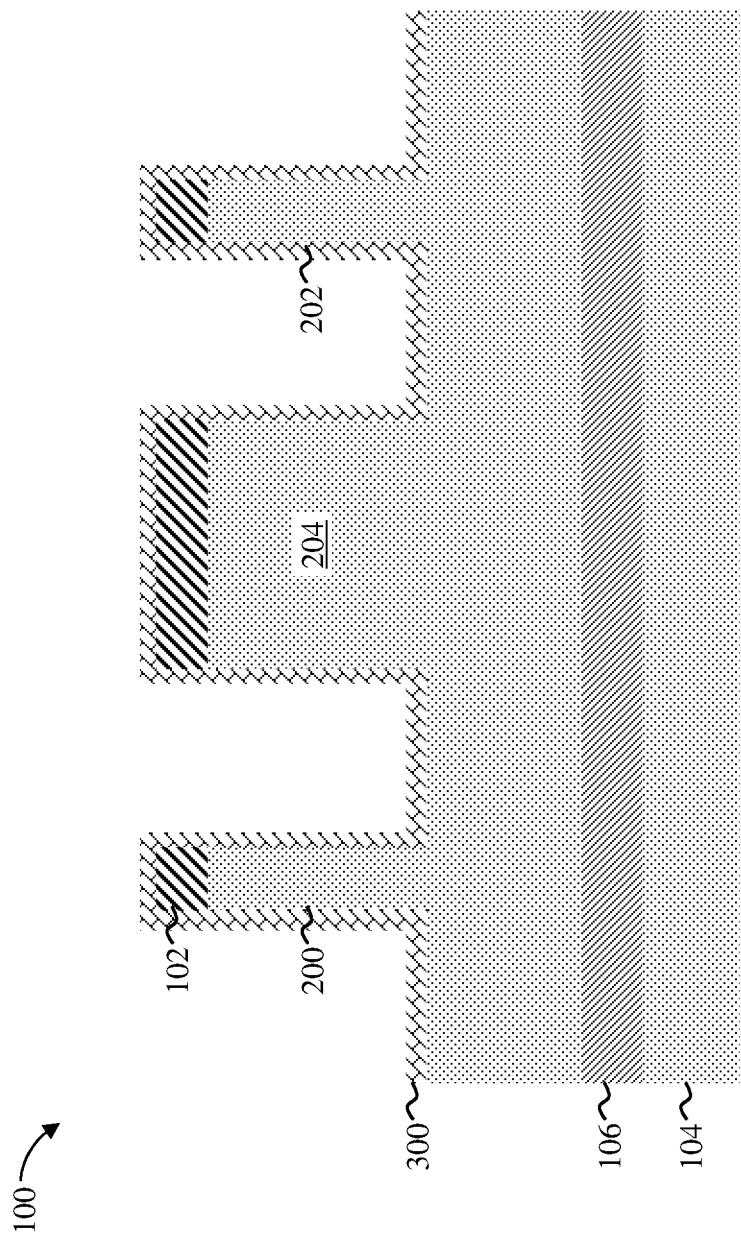
FIG. 3 depicts a cross-sectional view of the semiconductor structure after a processing operation according to one or more embodiments of the present invention.

FIG. 3 depicts a cross-sectional view of the structure 100 after forming a liner 300 over the substrate 104, the fins 200 and 202, and the pillar 204 during an intermediate operation of a method of fabricating a semiconductor device according to one or more embodiments of the invention. The liner 300 can be any suitable dielectric material, such as, for example, an oxide or a silicon oxide. The liner 300 can be conformally formed using a CVD, PECVD, ALD, PVD, chemical solution deposition, or other like process.

Figure 4:
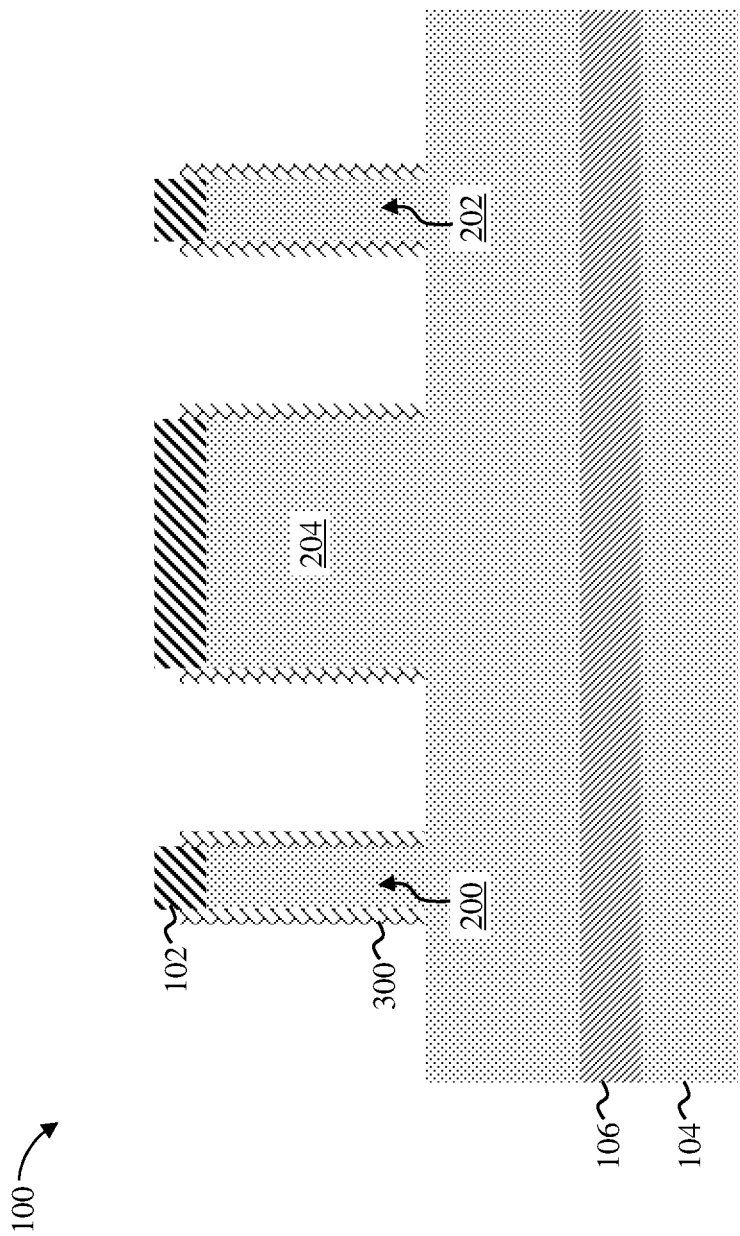
FIG. 4 depicts a cross-sectional view of the semiconductor structure after a processing operation according to one or more embodiments of the present invention.

FIG. 4 depicts a cross-sectional view of the structure 100 after removing portions of the liner 300 to expose a surface of the substrate 104 and the hard mask 102 during an intermediate operation of a method of fabricating a semiconductor device according to one or more embodiments of the invention. The liner 300 can be removing using any suitable process, such as, for example, a wet etch, a dry etch, or a combination thereof. In some embodiments of the present invention, the liner 300 is removed selective to the hard mask 102 and/or the substrate 104. After the liner etch back, portions of the liner 300 remain on sidewalls of the fins 200 and 202 and on sidewalls of the pillar 204.

Figure 16:
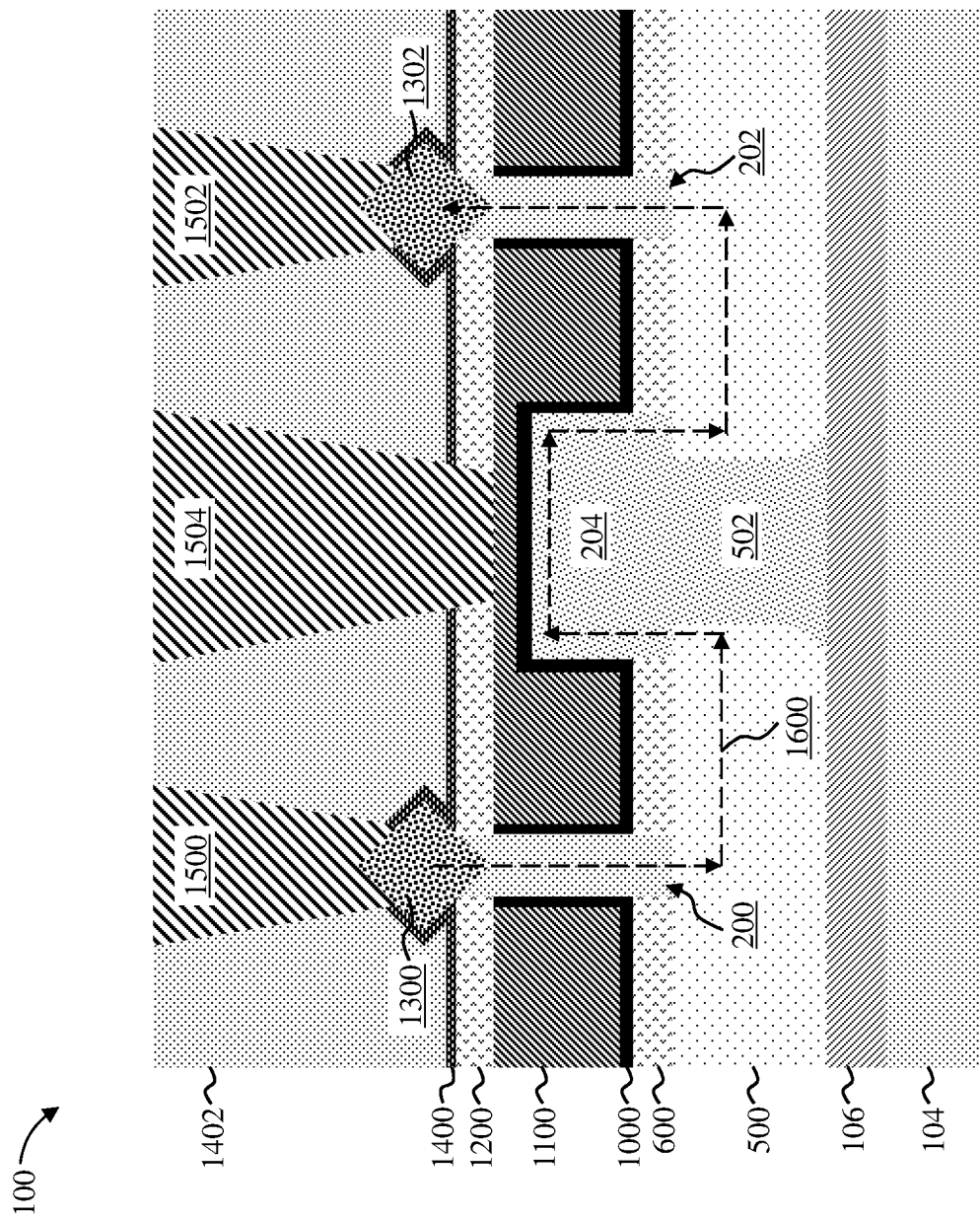
FIG. 16 depicts a cross-sectional view of the semiconductor structure after a processing operation according to one or more embodiments of the present invention.

FIG. 5 depicts a cross-sectional view of the structure 100 after doping a portion of the substrate 104 over the PTS 106 to form a bottom doped region 500 during an intermediate operation of a method of fabricating a semiconductor device according to one or more embodiments of the invention. The bottom doped region 500 can be formed using, for example, diffusion and/or ion implantation. The bottom doped region 500 provides a conductive path between the fins 200 and 202 and the pillar 204 during an active or ON state (as depicted in FIG. 16). As discussed previously herein, the width of the pillar 204 can be much greater (e.g., more than twice) the width of the fins 200 and 202. Consequently, the bottom doped region 500 can extend fully under the fins 200 and 202 but only partially under the pillar 204. In this manner, a blocking region 502 is formed under the pillar 204. The PTS 106 serves as an implantation barrier during this process to limit the implantation depth of the bottom doped region 500. In a similar manner, the remaining portions of the liner 300 prevent the implantation process from doping the fins 200 and 202 and the pillar 204.

The bottom doped region 500 can be doped during deposition (in-situ doped) or doped following the epitaxy by adding n-type dopants (e.g., As, P, Sb) or p-type dopants (e.g., Ga, B, In, $BF_2$, Al), depending on the type of transistor (i.e., n-type dopants for an nFET and p-type dopants for a pFET). The dopant concentration in the bottom doped region 500 can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

Figure 6:
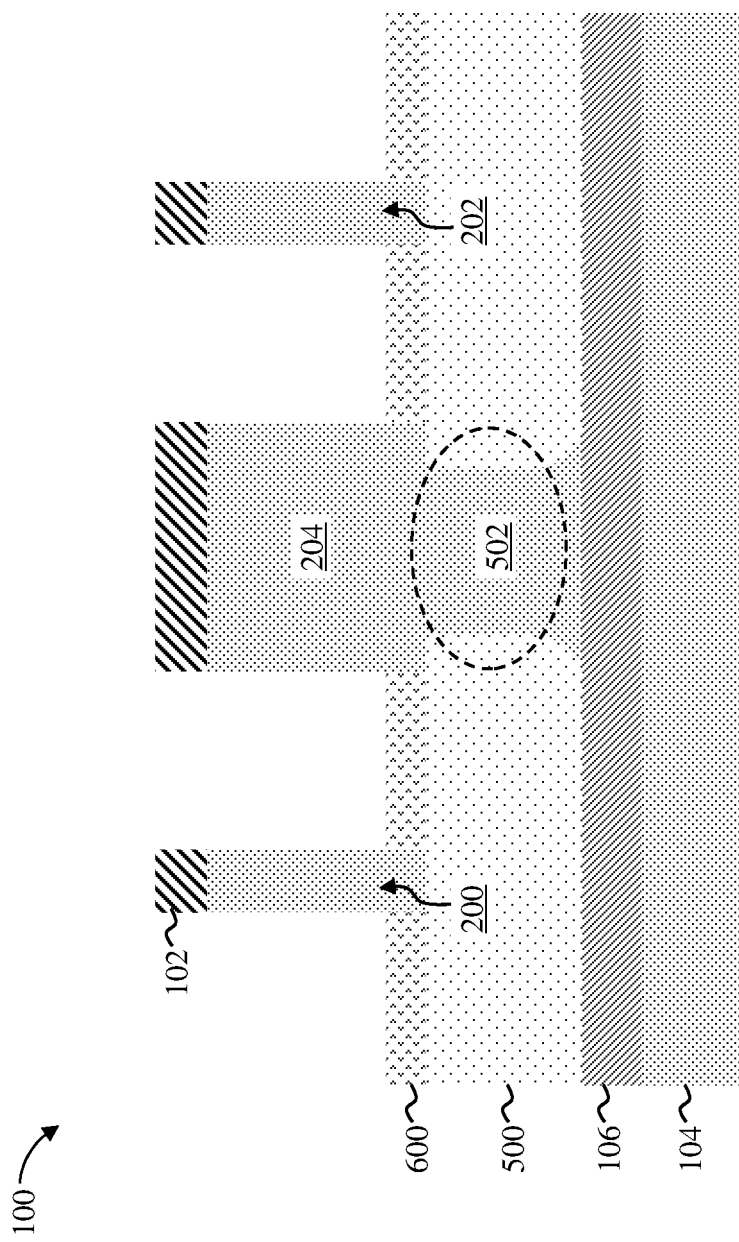
FIG. 6 depicts a cross-sectional view of the semiconductor structure after a processing operation according to one or more embodiments of the present invention.

FIG. 6 depicts a cross-sectional view of the structure 100 after removing the liner 300 and forming a bottom spacer 600 over the bottom doped region 500 during an intermediate operation of a method of fabricating a semiconductor device according to one or more embodiments of the invention. The liner 300 can be removed using known processes, such as, for example, a wet etch, a dry etch, or a combination thereof. In some embodiments of the present invention, the liner 300 is removed using RIE selective to the hard mask 102.

The bottom spacer 600 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The bottom spacer 600 can be formed using known deposition processes, such as, for example, CVD, PECVD, ALD, PVD, chemical solution deposition, or other like processes. In some embodiments of the present invention, the bottom spacer 600 is formed by performing a directional deposition process such as, for example, a Gas Cluster Ion Beam (GCIB) process. The GCIB process is a deposition process that can be highly directional in nature. For example, the directional deposition process can result in the deposition of dielectric material on the horizontally oriented surfaces of the device, such as a surface of the bottom doped region 500, while avoiding deposition of any substantial amount of dielectric material on the vertically-oriented surfaces of the device, such as sidewalls of the fins 200 and 202.

Figure 7:
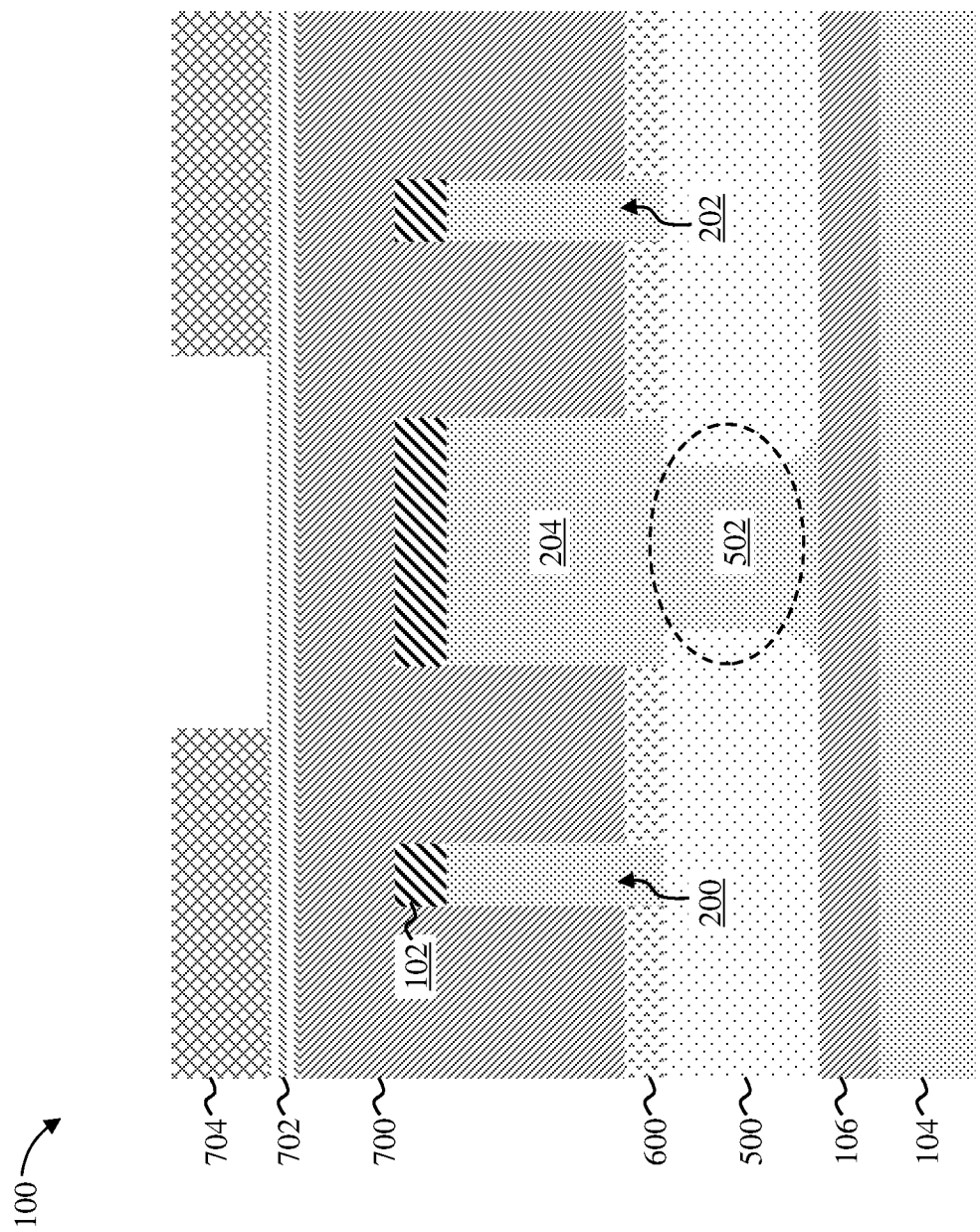
FIG. 7 depicts a cross-sectional view of the semiconductor structure after a processing operation according to one or more embodiments of the present invention.

FIG. 7 depicts a cross-sectional view of the structure 100 after forming a planarization layer 700, a hard mask 702, and a patterned photoresist 704 over the bottom spacer 600, the fins 200 and 202, and the pillar 204 during an intermediate operation of a method of fabricating a semiconductor device according to one or more embodiments of the invention. In some embodiments of the present invention, the planarization layer 700 is an organic planarization layer (OPL). The hard mask 702 (also known as a memorization layer) can be any suitable photomask material, such as, for example, SiARC, TiARC, $SiO_2$, SiN, or other materials providing for etch selectivity with the hard mask 102.

Figure 8:
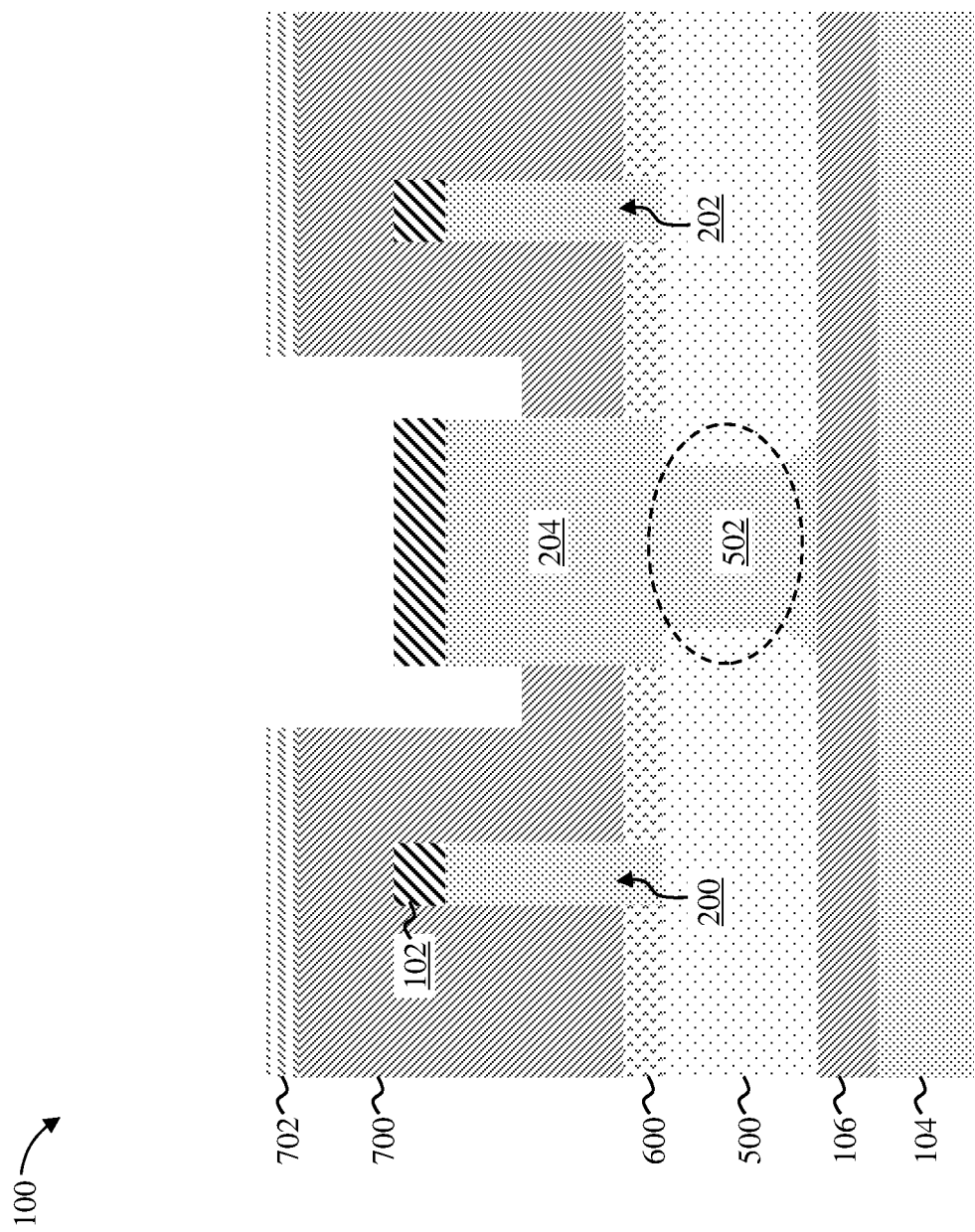
FIG. 8 depicts a cross-sectional view of the semiconductor structure after a processing operation according to one or more embodiments of the present invention.

FIG. 8 depicts a cross-sectional view of the structure 100 after exposing a surface of the hard mask 102 during an intermediate operation of a method of fabricating a semiconductor device according to one or more embodiments of the invention. The hard mask 102 can be exposed by removing portions of the planarization layer 700 and hard mask 702 using, for example, a wet etch, a dry etch, or a combination thereof. In some embodiments of the present invention, a pattern is transferred from the patterned photoresist 704 into the hard mask 702. The patterned hard mask 702 can then be used as an etch mask. In some embodiments of the present invention, a RIE selective to the hard mask 102 and/or the pillar 204 is used to expose the hard mask 102. In some embodiments of the present invention, the RIE also exposes sidewalls of the pillar 204. Remaining portions of the patterned hard mask 702 and/or the planarization layer 700 provide isolation to non-pillar regions during the subsequent recess and implantation of the pillar 204 (as depicted in FIG. 9).

Figure 9:
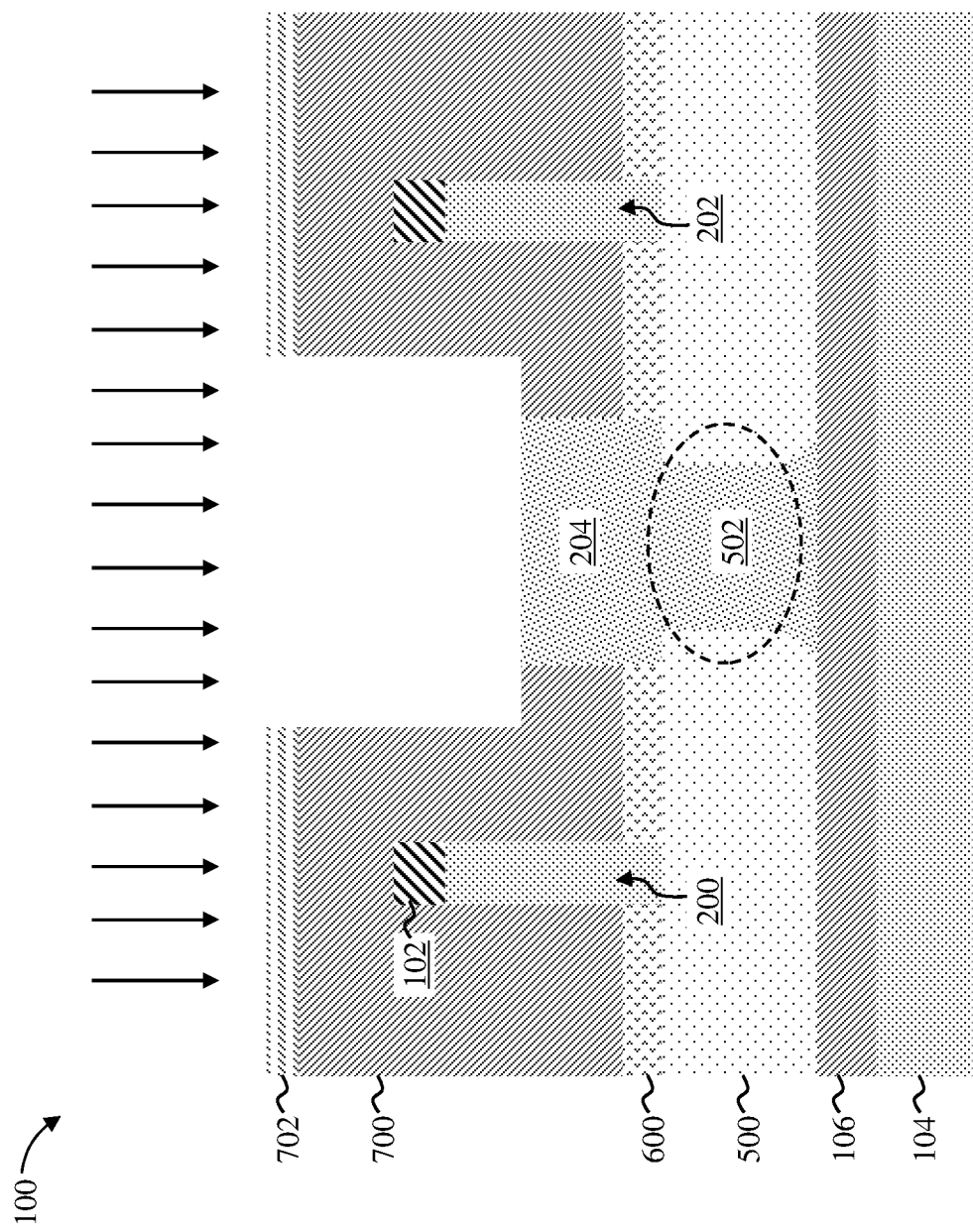
FIG. 9 depicts a cross-sectional view of the semiconductor structure after a processing operation according to one or more embodiments of the present invention.
Figure 15:
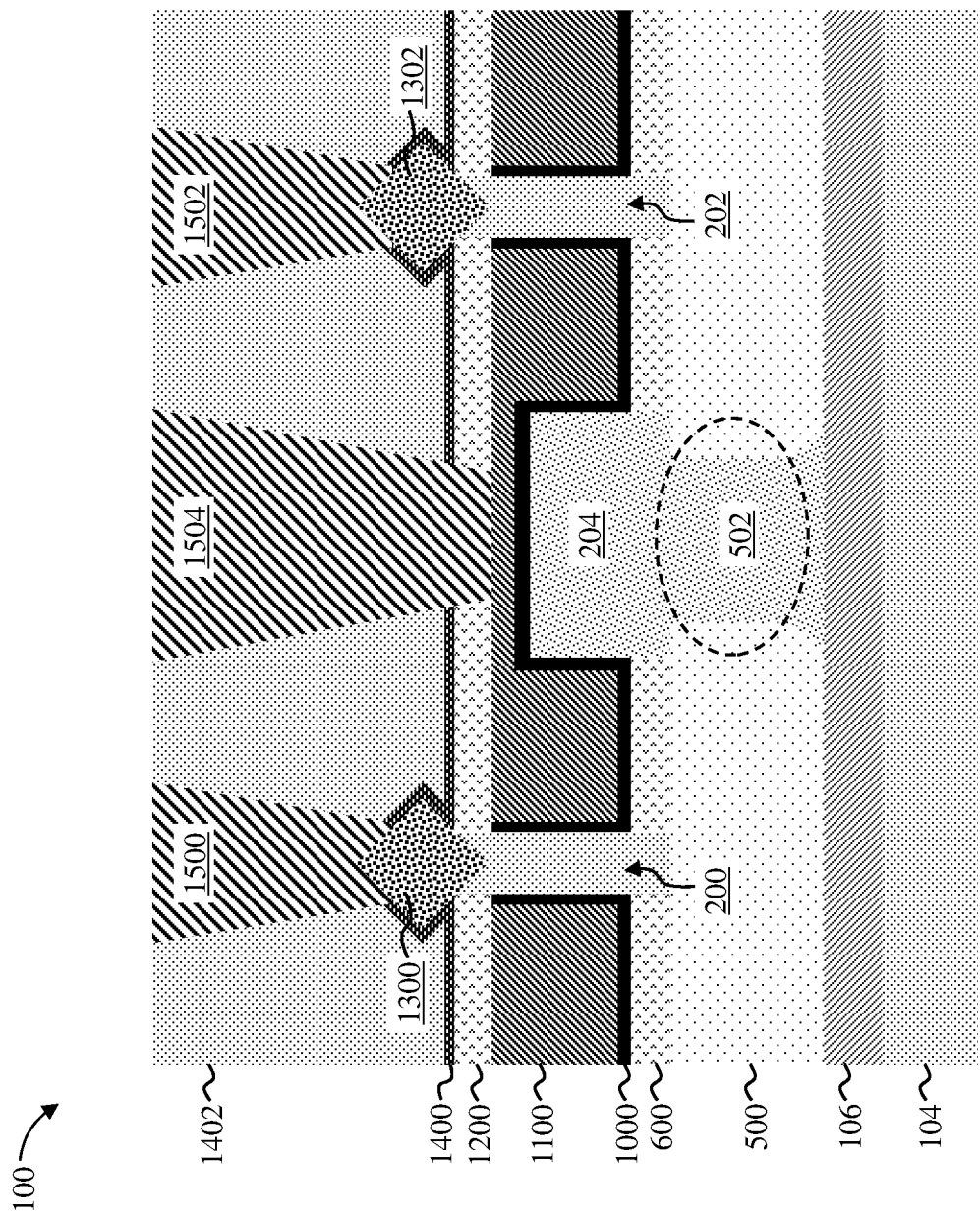
FIG. 15 depicts a cross-sectional view of the semiconductor structure after a processing operation according to one or more embodiments of the present invention.

FIG. 9 depicts a cross-sectional view of the structure 100 after recessing the pillar 204 during an intermediate operation of a method of fabricating a semiconductor device according to one or more embodiments of the invention. In some embodiments of the present invention, the hard mask 102 formed on the pillar 204 is remove prior to recessing the pillar 204. The pillar 204 is recessed below a top surface of the fins 200 and 202. For example, the pillar 204 can be recessed about 5 to about 10 nm below a surface of the fins 200 and 202, although other recess depths are within the contemplated scope of the invention. In this manner, a portion of the conductive gate 1100 (as depicted in FIG. 11) will be formed between the pillar 204 and the gate contact 1504 (as depicted in FIG. 15).

In some embodiments of the present invention, the pillar 204 and the blocking region 502 are doped prior to or after the pillar recess, using, for example, diffusion and/or ion implantation. The pillar 204 and the blocking region 502 can be doped during deposition (in-situ doped) or doped following the epitaxy by adding complementary n-type dopants (e.g., As, P, Sb) or p-type dopants (e.g., Ga, B, In, $BF_2$, Al), depending on the doping type of the bottom doped region 500 (i.e., p-type dopants for an nFET and n-type dopants for a pFET). The dopant concentration in the pillar 204 and the blocking region 502 can range from $1 \times 10^{16}$ $cm^{-3}$ to $1 \times 10^{18}$ $cm^{-3}$.

Figure 10:
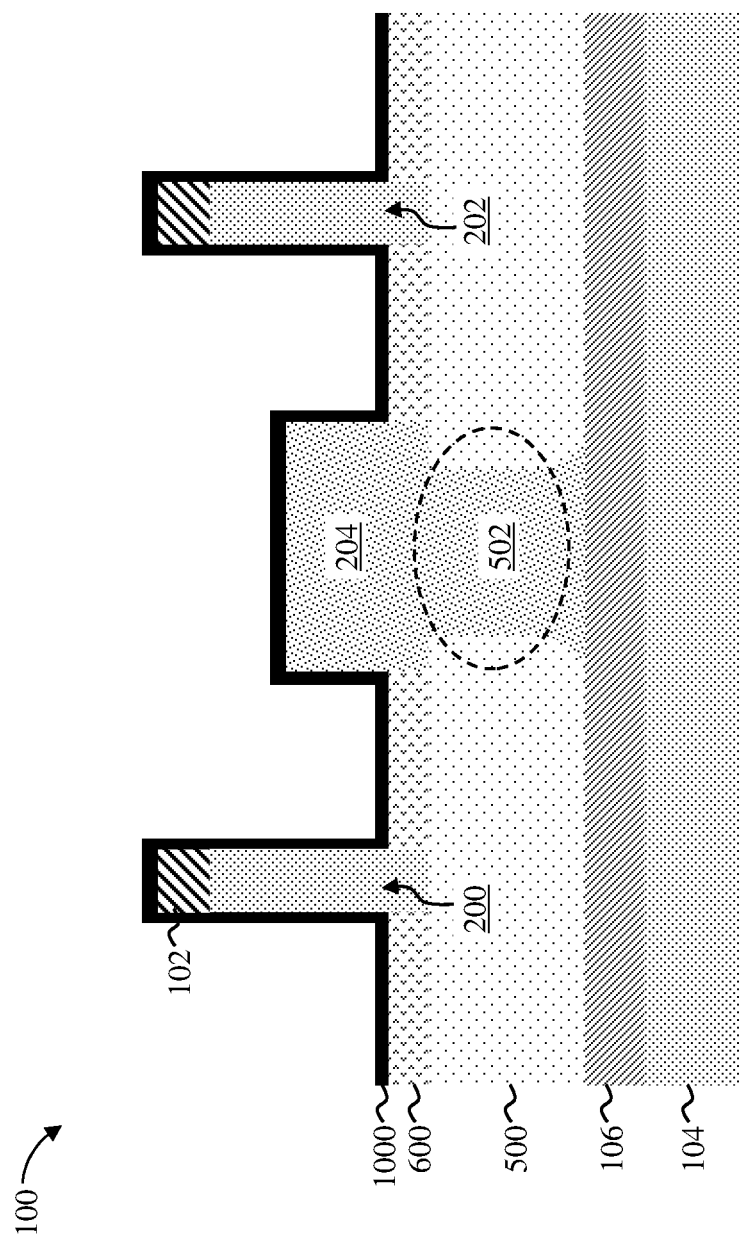
FIG. 10 depicts a cross-sectional view of the semiconductor structure after a processing operation according to one or more embodiments of the present invention.

FIG. 10 depicts a cross-sectional view of the structure 100 after removing the planarization layer 700 and the hard mask 702 and depositing an oxide layer 1000 (also referred to as a gate dielectric) during an intermediate operation of a method of fabricating a semiconductor device according to one or more embodiments of the invention. The oxide layer 1000 can be conformally formed using a CVD, PECVD, ALD, PVD, chemical solution deposition, or other like process. The thick oxide 1000 can be any suitable material, such as, for example, a silicon oxide.

Figure 11:
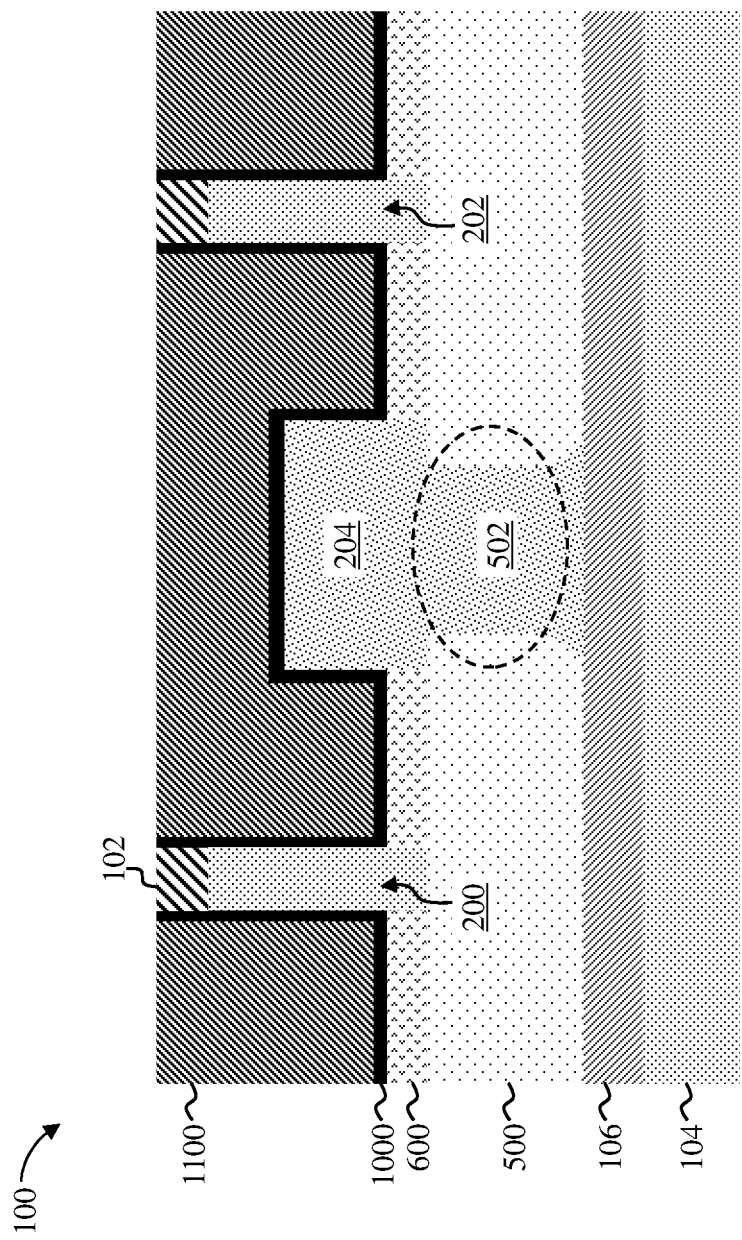
FIG. 11 depicts a cross-sectional view of the semiconductor structure after a processing operation according to one or more embodiments of the present invention.

The oxide layer 1000 is formed between the conductive gate 1100 (as depicted in FIG. 11) and the fins 200 and 202 and the pillar 204. The oxide layer 1000 can be formed to a thickness of about 1 nm to about 20 nm, although other thicknesses are within the contemplated scope of the invention. In some embodiments of the present invention, the oxide layer 1000 is a thick oxide layer having a thickness of greater than about 10 nm suitable for use in a high voltage device having a positive supply voltage of greater than about 1.5 volts. Thick-oxide devices have a larger capacitance and lower bandwidth than thin-oxide devices due to the thick oxide layer and are used in applications where exposure to high voltage can cause damage to the device.

FIG. 11 depicts a cross-sectional view of the structure 100 after forming a conductive gate 1100 during an intermediate operation of a method of fabricating a semiconductor device according to one or more embodiments of the invention. The conductive gate 1100 is a shared gate formed over channel regions of both of the fins 200 and 202 and over the pillar 204 using known VFET processes. In some embodiments of the present invention, the conductive gate 1100 is overfilled above a surface of the hard mask 102 and then planarized to a surface of the hard mask 102 using, for example, CMP.

The conductive gate 1100 can be a high-k metal gate (HKMG) and can include, for example, one or more high-k dielectric films (not depicted) and one or more work function metals (WFM, not depicted). The one or more high-k dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric films can further include dopants such as, for example, lanthanum and aluminum. The high-k dielectric films can be formed by suitable deposition processes, for example, CVD, PECVD, atomic layer deposition (ALD), evaporation, physical vapor deposition (PVD), chemical solution deposition, or other like processes. The thickness of the high-k dielectric films can vary depending on the deposition process as well as the composition and number of high-k dielectric materials used. The high-k dielectric films can have a thickness in a range from about 0.5 to about 20 nm.

The WFM can be disposed over the high-k dielectric films. The type of work function metal depends on the type of transistor and can differ between the nFET and pFET devices. P-type work function metals include compositions such as ruthenium, palladium, platinum, cobalt, nickel, and conductive metal oxides, or any combination thereof. N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof. The WFM can be deposited by a suitable deposition process, for example, CVD, PECVD, PVD, plating, thermal or e-beam evaporation, and sputtering.

The bulk material (gate conductor material) for the conductive gate 1100 can be deposited over the high-k dielectric films and WFM to form a HKMG. Non-limiting examples of suitable conductive materials include aluminum (Al), platinum (Pt), gold (Au), tungsten (W), titanium (Ti), or any combination thereof. The gate conductor material can be deposited by a suitable deposition process, for example, CVD, PECVD, PVD, plating, thermal or e-beam evaporation, and sputtering.

Figure 12:
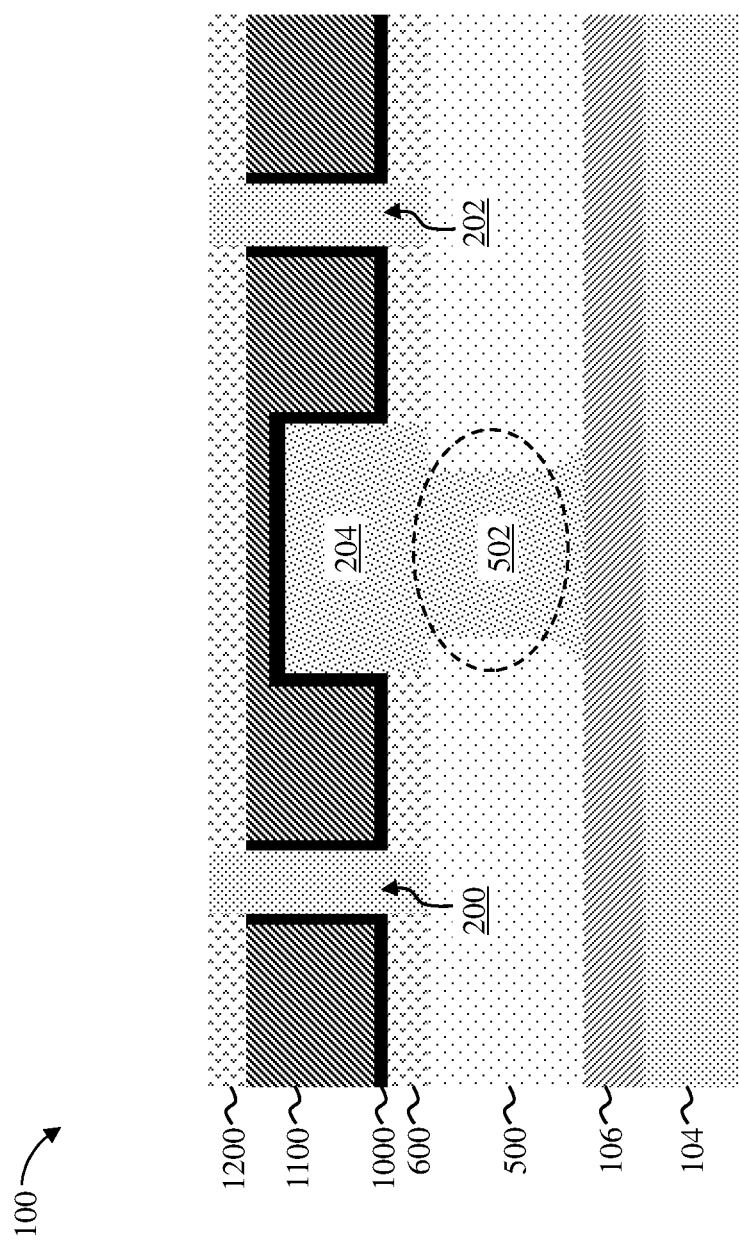
FIG. 12 depicts a cross-sectional view of a semiconductor structure after a processing operation according to one or more embodiments of the present invention.

FIG. 12 depicts a cross-sectional view of the structure 100 after removing the hard mask 102, recessing the conductive gate 1100, and forming a top spacer 1200 over the recessed conductive gate 1100 during an intermediate operation of a method of fabricating a semiconductor device according to one or more embodiments of the invention. The hard mask 102 can be removed using known hard mask open processes, such as, for example, a wet etch, a dry etch, or a combination thereof. In some embodiments of the present invention, the conductive gate 1100 is recessed below a surface of the fins 200 and 202 but above a surface of the pillar 204. The conductive gate 1100 can be recessed using any suitable process, such as, for example, a wet etch, a dry etch, or a combination thereof. In some embodiments of the present invention, the conductive gate 1100 is etched selective to the fins 200 and 202.

The top spacer 1200 can include a dielectric material, such as, for example, SiN, SiC, SiOC, SiCN, BN, SiBN, SiBCN, SiOCN, SiO$_x$N$_y$, and combinations thereof. The dielectric material can be a low-k material having a dielectric constant less than about 7, less than about 5, or even less than about 2.5. The top spacer 1200 can be formed using known deposition processes, such as, for example, CVD, PECVD, ALD, PVD, chemical solution deposition, or other like processes. In some embodiments of the present invention, the top spacer 1200 is formed by performing a directional deposition process such as, for example, a Gas Cluster Ion Beam (GCIB) process, in a similar manner as the bottom spacer 600.

Figure 13:
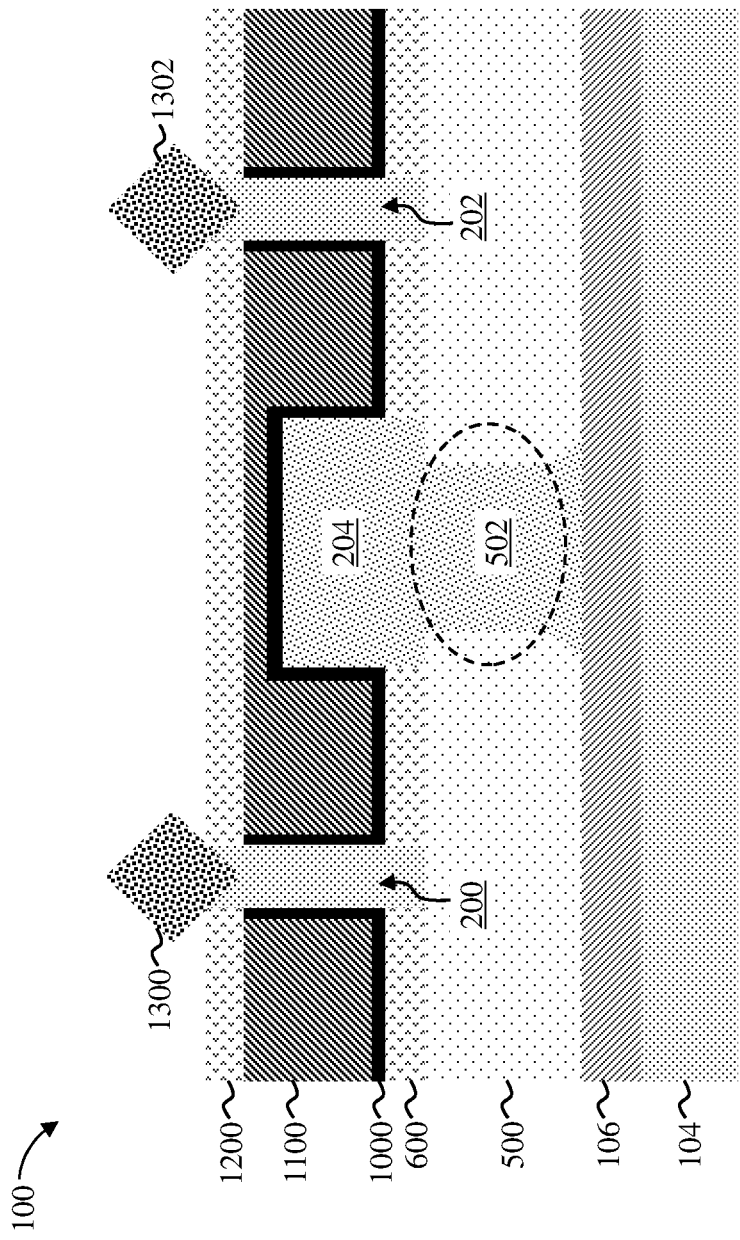
FIG. 13 depicts a cross-sectional view of the semiconductor structure after a processing operation according to one or more embodiments of the present invention.

FIG. 13 depicts a cross-sectional view of the structure 100 after forming a source region 1300 on the fin 200 and a drain region 1302 on the fin 202 during an intermediate operation of a method of fabricating a semiconductor device according to one or more embodiments of the invention. The source/drain regions 1300 and 1302 can be formed by selective epitaxial growth over exposed surfaces of the fins 200 and 202. The source/drain regions 1300 and 1302 can include epitaxial semiconductor materials grown from gaseous or liquid precursors. For example, epitaxial semiconductor materials can be grown using vapor-phase epitaxy (VPE), molecular-beam epitaxy (MBE), liquid-phase epitaxy (LPE), or other suitable processes.

In some embodiments of the present invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Epitaxial silicon, silicon germanium, and/or carbon doped silicon (Si:C) can be doped during deposition (in-situ doped) or doped following the epitaxy by adding n-type dopants (e.g., As, P, Sb) or p-type dopants (e.g., Ga, B, In, BF$_2$, Al), depending on the type of transistor (i.e., n-type dopants for an nFET and p-type dopants for a pFET). The dopant concentration in the source/drain regions 1300 and 1302 can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

Figure 14:
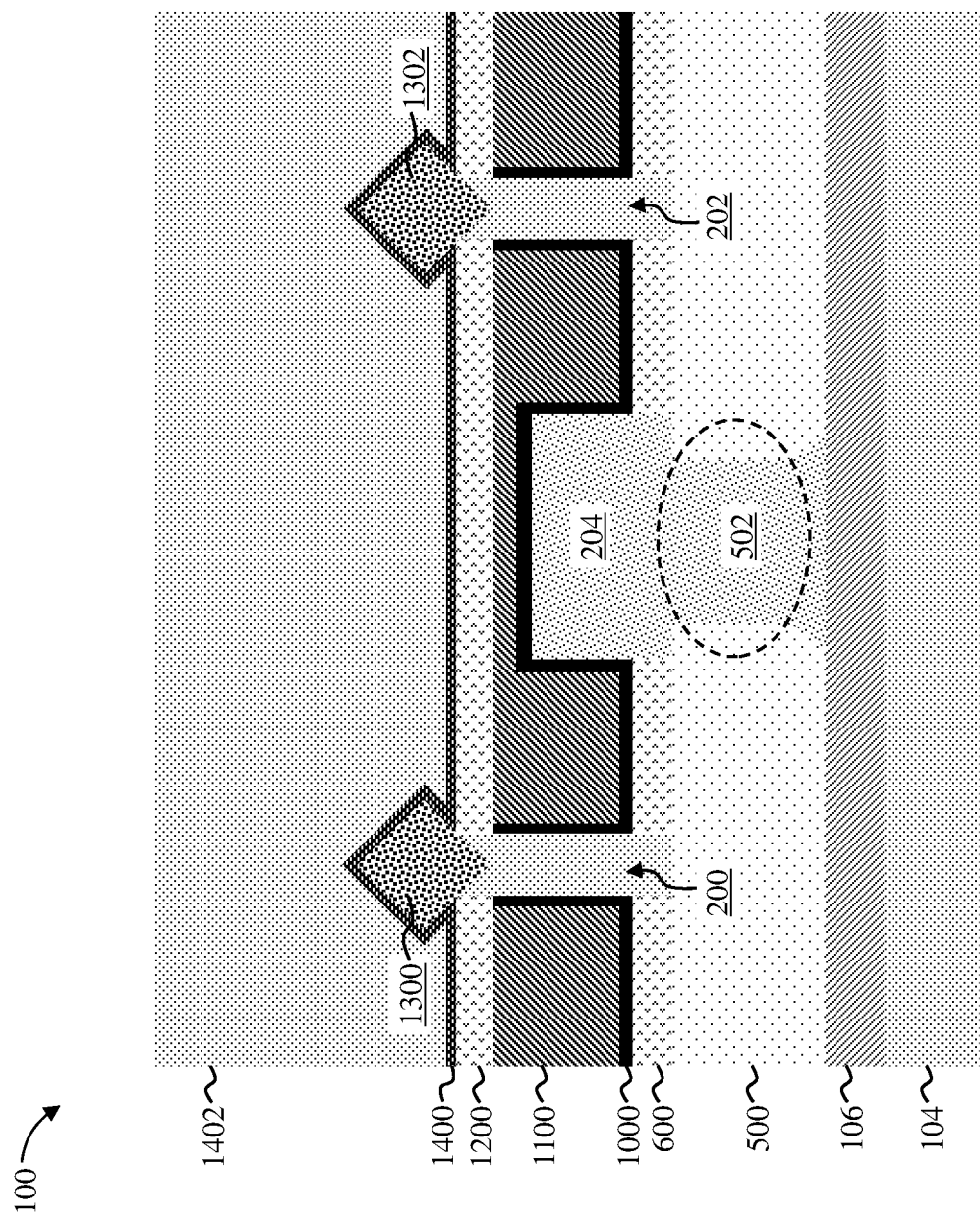
FIG. 14 depicts a cross-sectional view of the semiconductor structure after a processing operation according to one or more embodiments of the present invention.

FIG. 14 depicts a cross-sectional view of the structure 100 after forming a liner 1400 over the top spacer 1200 and the source/drain regions 1300 and 1302 during an intermediate operation of a method of fabricating a semiconductor device according to one or more embodiments of the invention. The liner 1400 can include a dielectric material, such as, for example, SiN, SiC, SiOC, SiCN, BN, SiBN, SiBCN, SiOCN, SiO$_x$N$_y$, and combinations thereof. The liner 1400 can be formed using known deposition processes, such as, for example, CVD, PECVD, ALD, PVD, chemical solution deposition, or other like processes. An interlayer dielectric (ILD) 1402 is formed over the liner 1400. The ILD 1402 can be any suitable dielectric material, such as, for example, a silicon oxide, and can be formed using any suitable process.

FIG. 15 depicts a cross-sectional view of the structure 100 after forming a source contact 1500, a drain contact 1502, and a gate contact 1504 (collectively, the "contacts") during an intermediate operation of a method of fabricating a semiconductor device according to one or more embodiments of the invention. The contacts 1500, 1502, and 1504 are formed in ohmic contact with the source region 1300, the drain region 1302, and the conductive gate 1100, respectively, using known metallization techniques. Although not shown in this cross-sectional view, it is understood that the gate contact 1504 is electrically coupled to all portions of the conductive gate 1100. In some embodiments of the present invention, the ILD 1402 is extended and then patterned with open trenches (not depicted). The contacts 1500, 1502, and 1504 are then deposited into the trenches. In some embodiments of the present invention, patterning the open trenches includes removing portions of the liner 1400 and top spacer 1200. In some embodiments of the present invention, the contacts 1500, 1502, and 1504 are overfilled into the trenches, forming overburdens above a surface of the ILD 1402. CMP can be used to remove the overburden.

The contacts 1500, 1502, and 1504 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition. In some embodiments of the present invention, the contacts 1500, 1502, and 1504 can be copper or tungsten and can include a barrier metal liner (not depicted). The barrier metal liner prevents the copper or tungsten from diffusing into, or doping, the surrounding materials, which can degrade their properties. Silicon, for example, forms deep-level traps when doped with copper. An ideal barrier metal liner must limit the bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide.

In some embodiments of the present invention, the contacts 1500, 1502, and 1504 include a metal (e.g., titanium) that reacts with semiconductor materials (e.g., the source and drain regions 1300 and 1302) to form a silicide film (not depicted) between the source and drain regions 1300 and 1302 and the contacts 1300 and 1302. As the silicide film is only formed at the interface between the contacts and the top S/D regions the silicide film can be said to be self-aligned to the top S/D regions (a self-aligned silicide is also referred to as a salicide).

FIG. 16 depicts a cross-sectional view of the structure 100 having a super long current path 1600 (also known as an electrical path or channel path) during an ON state according to one or more embodiments of the invention. The current path 1600 starts at the source region 1300, passes along a surface of the pillar 204, and ends at the drain region 1302. As previously discussed herein, the surface of the pillar 204 provides an increased channel length between the source and drain regions 1300 and 1302 when the conductive gate 1100 is active. In this manner, a super long channel having a channel length more than twice as long as the individual channel for either fin 200 or 202 is provided. Advantageously, the super long channel does not require an increase in the total height of the channel region of the fins 200 and 202 or an increase in the height of the conductive gate 1100.

Figure 17:
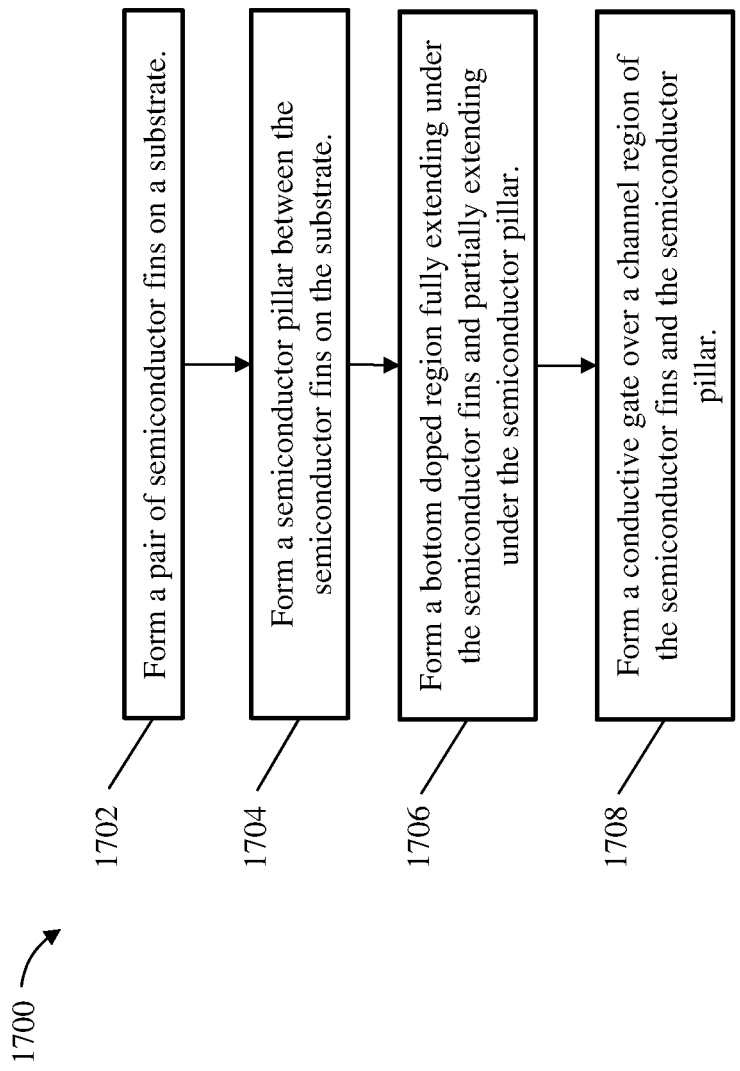
FIG. 17 depicts a flow diagram illustrating a method according to one or more embodiments of the invention.

FIG. 17 depicts a flow diagram 1700 illustrating a method for forming a semiconductor device according to one or more embodiments of the invention. As shown at block 1702, a pair of semiconductor fins is formed on a substrate. The semiconductor fins can be formed in a similar manner as the fins 200 and 202 depicted in FIG. 2 according to one or more embodiments.

As shown at block 1704, a semiconductor pillar is formed between the semiconductor fins on the substrate. The semiconductor pillar can be formed in a similar manner as the pillar 204 depicted in FIG. 2 according to one or more embodiments.

As shown at block 1706, a bottom doped region is formed fully extending under the semiconductor fins and partially extending under the semiconductor pillar. The bottom doped region can be formed in a similar manner as the bottom doped region 500 depicted in FIG. 5 according to one or more embodiments. The bottom doped region provides a conductive path between the semiconductor fins and the semiconductor pillar.

As shown at block 1708, a conductive gate is formed over a channel region of the semiconductor fins and the semiconductor pillar. The conductive gate can be formed in a similar manner as the conductive gate 1100 depicted in FIG. 11 according to one or more embodiments. A surface of the semiconductor pillar serves as an extended channel region when the gate is active.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a pair of semiconductor fins on a substrate;
   forming a semiconductor pillar between the semiconductor fins on the substrate;
   forming a bottom doped region that extends under all of the semiconductor fins and under part of the semiconductor pillar;
   recessing the semiconductor pillar below a surface of the semiconductor fins; and
   forming a conductive gate over a channel region of the semiconductor fins and the semiconductor pillar.

2. The method of claim 1 further comprising doping the semiconductor pillar.

3. The method of claim 1 further comprising forming a thick oxide layer between the conductive gate and the semiconductor fins and the semiconductor pillar.

4. The method of claim 1 further comprising forming a bottom spacer between the conductive gate and the bottom doped region.

5. The method of claim 1 further comprising forming a top spacer on the conductive gate.

6. The method of claim 1 further comprising forming top doped regions on exposed surfaces of the semiconductor fins.

7. The method of claim 6 further comprising forming a conductive contact on the top doped regions.

8. The method of claim 7 further comprising forming a gate contact on the conductive gate and over the semiconductor pillar.

9. The method of claim 1, wherein a thickness of the semiconductor pillar is larger than a thickness of the semiconductor fins.

* * * * *